United States Patent [19]

Matsui et al.

[11] Patent Number: 5,239,501
[45] Date of Patent: Aug. 24, 1993

[54] STATIC MEMORY CELL

[75] Inventors: Masataka Matsui, Tokyo; Kiyofumi Ochii, Yokohama, both of Japan

[73] Assignee: Kabushiki Kaisha Toshiba, Kawasaki, Japan

[21] Appl. No.: 735,047

[22] Filed: Jul. 24, 1991

[30] Foreign Application Priority Data

Jul. 25, 1990 [JP] Japan ................................ 2-194982

[51] Int. Cl.$^5$ ............................................. G11C 11/40
[52] U.S. Cl. .................................... 365/154; 365/177; 365/188
[58] Field of Search ................. 365/189.01, 189.07, 365/154, 177, 190, 181

[56] References Cited

U.S. PATENT DOCUMENTS

| | | | |
|---|---|---|---|
| 4,409,679 | 10/1983 | Kurafuji et al. | 365/190 |
| 4,435,789 | 3/1984 | Yasuoka | 365/190 |
| 4,862,421 | 8/1989 | Tran | 365/177 |
| 4,933,899 | 6/1990 | Gibbs | 365/177 |

FOREIGN PATENT DOCUMENTS 0112588  5/1989  Japan ........................ 365/189.01

OTHER PUBLICATIONS

IEEE Journal of Solid-State Circuits, vol. 23, No. 5, Oct. 1988; pp. 1030–1040.

Primary Examiner—Eugene R. LaRoche
Assistant Examiner—Vu Le
Attorney, Agent, or Firm—Finnegan, Henderson, Farabow, Garrett & Dunner

[57] ABSTRACT

In a static memory, a memory cell is constituted by only the same-channel MOSFETs. With the MOSFETs of the same channel, no well isolation region is required, and a cell size can be decreased. Moreover, the high potential side power source of a flip-flop can be used as a read word line. Thus the read word line can be driven by an ECL logic circuit.

10 Claims, 3 Drawing Sheets

STATIC MEMORY CELL

BACKGROUND OF THE INVENTION

1. Field of the Invention

The present invention relates to a static memory (SRAM) cell and, more particularly, to a static memory cell used in a BiCMOS technique in which a bipolar transistor and a CMOS circuit are formed on the same substrate.

2. Description of the Related Art

FIG. 1 is a circuit diagram showing a conventional static memory cell having four high-resistance load transistors often used in a CMOS SRAM. Resistor elements R1 and R2 and n-channel MOSFETs (NMOSFET) Q1 and Q2 cross-connected to each other are connected between a positive potential power source 1 and a negative potential power source (ground potential) to obtain a flip-flop. The flip-flop is used as a memory cell. A word line WL is connected to the gates of access transistors Q3 and Q4. The access transistors Q3 and Q4 are selected by the word line WL and have drains respectively connected to internal nodes A and B for extracting complementary outputs of the flip-flop and sources respectively connected to a pair of complementary bit lines BL and $\overline{BL}$.

In both read and write operations, the word line WL connected to a memory cell to be selected is set to be a high potential. In the read operation, when the pair of bit lines BL and $\overline{BL}$ are charged to a high potential such that cell data is not inverted, and a cell current flows in a low-potential side bit line of the pair of bit lines BL and $\overline{BL}$ of the nodes A and B to pull down bit line to the low-potential side, a potential difference occurs between the bit lines BL and $\overline{BL}$. This potential difference is read out by a differential sense amplifier. In the write operation, after the word line WL is selected, a high-potential signal is input to one of the bit lines BL and $\overline{BL}$, and a low-potential signal is input the other of the bit lines BL and $\overline{BL}$, thereby updating data of the flip-flop of the memory cell.

In this high-resistance load memory cell, the word line of a non-selected cell, i.e., a waiting cell, must be set to be the same potential as the low-potential power source due to the following reason. The access transistors Q3 and Q4 connected to the word line WL of the waiting cell are turned on at an intermediate potential except for the potential of the low potential power source, and a cell current flows from the bit line through the access transistors, thereby increasing power consumption during the waiting operation. Therefore, a CMOS logic circuit must be used for selecting a word line.

This condition is not changed even when a BiCMOS technique which has been used in a high speed, large-capacity SRAM is employed as in recent years, as long as a memory cell having the above arrangement is used. In a BiCMOS SRAM, especially an ECL BiCMOS SRAM having an input/output mode applied for an ECL, in order to shorten an access time almost equal to that of an ECL bipolar SRAM, all peripheral circuits are preferably constituted by ECL logic circuits which are operated at a speed higher than a CMOS logic circuit.

However, in order to prevent an increase in power consumption of a non-selected memory cell, a CMOS logic circuit must be used as a circuit for driving a word line. This is because an output having the same potential as that of the low-potential power source cannot be theoretically obtained by the ECL logic circuit. For this reason, when the CMOS circuit is used as a word line drive circuit, the operation speed is decreased compared with a case wherein the ECL circuit is used as the word line drive circuit. In addition, since an ECL logic level must be converted into a CMOS logic level, an access time is disadvantageously further prolonged by the conversion time.

As a means for solving the above problem, a memory cell shown in circuit diagram of FIG. 2 is proposed. In this memory cell, a flip-flop is constituted by NMOSFETs Q1 and Q2 cross-connected to each other and p-channel MOSFETs Q5 and Q6. The sources of the NMOSFETs are connected to a negative potential power source (ground potential), and the sources of the PMOSFETs are connected to a read word line RWL. In addition, an internal node A is connected to a write bit line $\overline{WBL}$ through an access transistor Q3 selected by a write word line WWL and having the gate connected to the write word line WWL. An internal node B is connected to a read bit line RBL through an npn bipolar transistor T1 having the base connected to the internal node B, the collector connected to a positive potential power source, and the emitter connected to the read bit line RBL. A sense amplifier 11 constituted by an npn transistor $T_{REF}$, a resistor $R_{REF}$, and a constant current source 12 is connected to the read bit line RBL.

A write operation of the memory cell in FIG. 2 is performed as shown in FIG. 1. That is, the write word line WWL is set to be a high potential during the write operation to turn on the access transistor Q3, the internal node A is connected to the write bit line $\overline{WBL}$, and a high or low potential is applied to the write bit line $\overline{WBL}$ from an external circuit, thereby updating data of the flip-flop. During a period except for the write operation, the write word line WWL is set to be the same potential as that of the low-potential power source.

A read operation of the memory cell is largely different from that of the memory cell shown in FIG. 1. The read word line RWL is set to be a higher potential during the reading operation than that during the waiting operation. The read bit line RBL is charged to a potential $V_{REF}-Vf$ (Vf is a forward biasing base-emitter potential of the npn transistor $T_{REF}$, e.g., about 0.8 V) through the sense amplifier 11. A selection potential $V_{RWLH}$ of the read word line RWL during a selecting operation is set to be higher than the potential $V_{REF}$. In this case, when the node B is set to be a high potential during a cell selecting operation, a differential amplifier is constituted by the npn bipolar transistor T1 and the sense amplifier $T_{REF}$, and the potential of the read bit line RBL is set to be "$V_{RWLH}-Vf > V_{REF}-Vf$" to cut off the transistor $T_{REF}$. Subsequently, an output OUT is charged by the load resistor $R_{REF}$ to output a high-potential output. On the other hand, when the node B is set to be a low potential, i.e., the potential of the low-potential power source, the potential of the read bit line RBL is held at a potential "$V_{REF}-Vf$", the transistor $T_{REF}$ is turned on, and the transistor T1 is cut off. The output OUT outputs a low-potential output. As described above, the potential of the high-potential power source of the memory cell is applied to the read word line RWL to amplify the read word line RWL at a intermediate potential, and the read word line RWL can be driven by the ECL logic circuit. Therefore, even in the ECL BiCMOS SRAM, the same access time as that of the ECL bipolar SRAM can be obtained.

Although the memory cell in FIG. 1 is constituted by four NMOSFETs, the memory cell in FIG. 2 is constituted by three NMOSFETs, two PMOSFETs, and one npn bipolar transistor. Therefore, although the cell size of the memory cell in FIG. 2 is smaller than that of a bipolar memory cell, it becomes three or four times the memory cell in FIG. 1 to disable an increase in integration density. More specifically, when a PMOSFET and an NMOSFET are to be integrated in a single memory cell, an n-type well region for forming the PMOSFET must be isolated from a p-type well region for forming the NMOSFET in the memory cell by an isolation region. This is the most serious obstacle against a decrease in cell size.

SUMMARY OF THE INVENTION

It is an object of the present invention to provide a static memory cell in which a word line can be driven by an ECL logic circuit, power consumption during a waiting operation is almost equal to that of a CMOS memory, and a memory cell size is only slightly larger than that of a CMOS memory cell.

According to the present invention, there is provided a static memory cell, comprising a first resistor element having one terminal connected to a first potential power source and the other terminal connected to a first internal node, a second resistor element having one terminal connected to the first potential power source and the other terminal connected to a second internal node, a first first-channel MOSFET having a drain connected to the first internal node, a source connected to a read word line, and a gate connected to the second internal node, a second first-channel MOSFET having a drain connected to the second internal node, a source connected to the read word line, and a gate connected to the first internal node, a third first-channel MOSFET having a drain connected to the first internal node, a source connected to a first write bit line, and a gate connected to a write word line, a fourth first-channel MOSFET having a drain connected to the second internal node, a source connected to a second write bit line, and a gate connected to the write word line, and a first bipolar transistor of a first polarity having a collector connected to a second potential power source, a base connected to the second internal node, and an emitter connected to a first read bit line. According to another aspect of the present invention, the static memory cell further comprises a second bipolar transistor of the first polarity having an emitter connected to the first read bit line to constitute a comparison amplifier with the first bipolar transistor of the first polarity.

According to the present invention, since a memory cell is constituted by only the same-channel MOSFETs, no well isolation region is required, and a cell size can be decreased. In addition, since the second potential power source of a flip-flop is used as a read word line, the read word line can be driven by an ECL logic circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
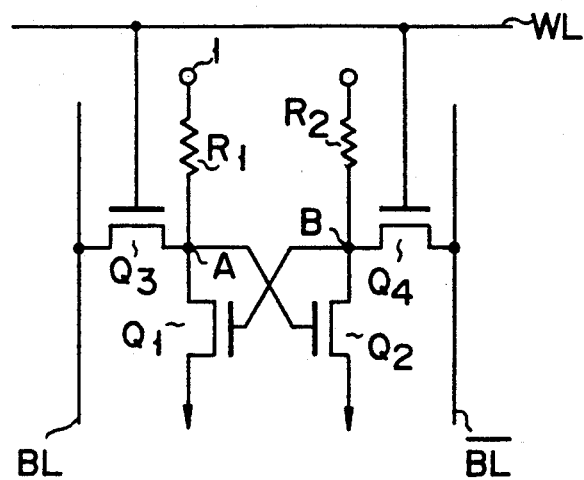
FIGS. 1 and 2 are circuit diagrams showing a conventional static memory cell.
Figure 2:
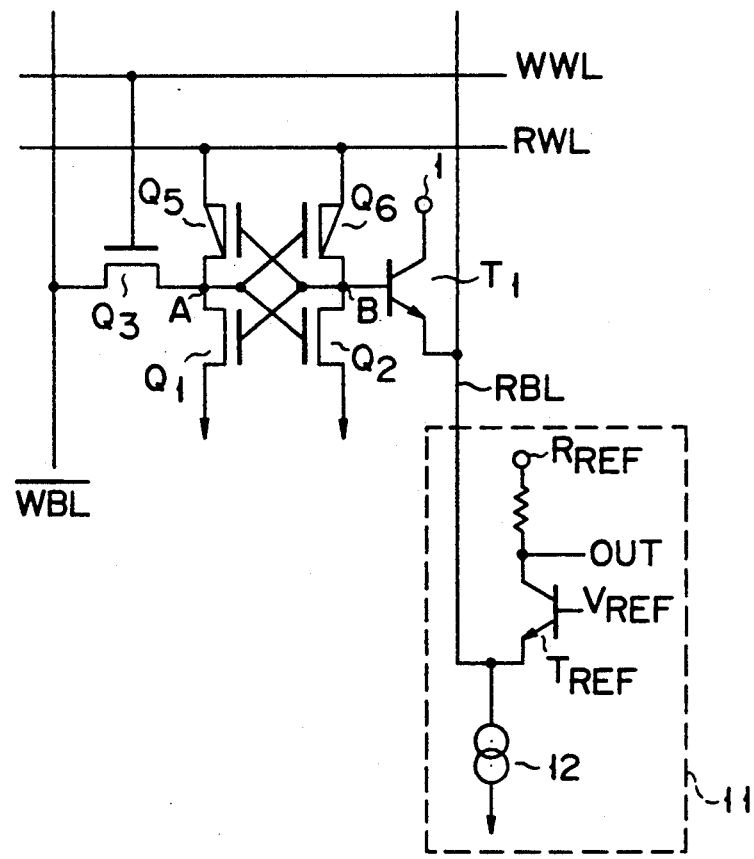
Figure 3:
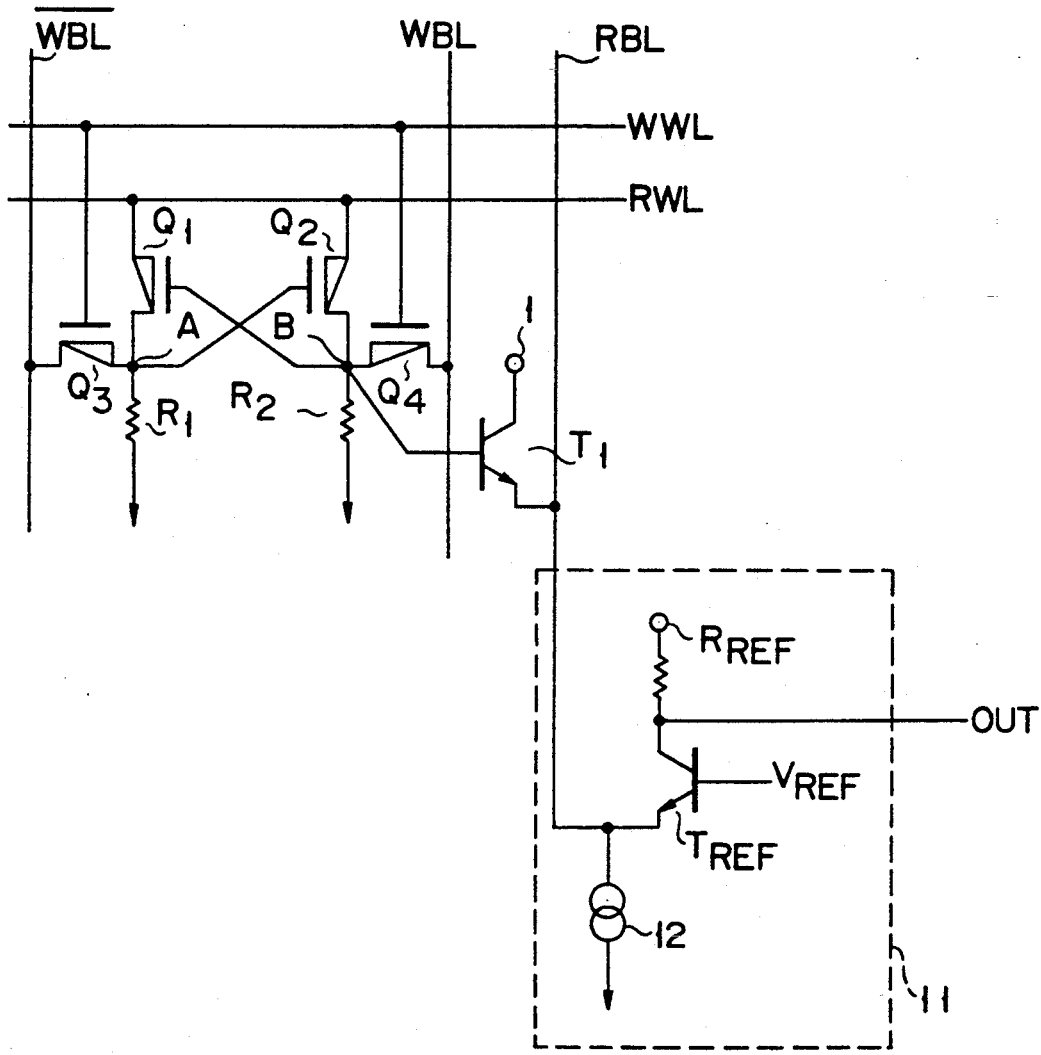
FIGS. 3 to 5 are circuit diagrams showing static memory cells according to the embodiments of the present invention.

An embodiment of the present invention will be described below with reference to the accompanying drawings. FIG. 3 is a circuit diagram showing a static memory cell according to this embodiment. Since this static memory cell corresponds to the above conventional static memory cell, the same reference numerals as in FIGS. 1 and 2 denote the same parts in FIG. 3. PMOSFETs Q1 and Q2 cross-connected to each other and resistor elements R1 and R2 are formed between a negative potential power source (ground potential) and a read word line RWL to obtain a flip-flop. The flip-flop is used as a memory element (memory cell). Reference symbols A and B denote a pair of complementary internal nodes of the flip-flop. The potential of the read word line RWL is set to be a potential on a high-potential side of the memory cell (the potential is different from a potential of a high-potential side of a chip) during waiting and selecting operations. An access transistor Q3 having the gate selectively controlled by a write word line WWL is connected between the internal node A and a write bit line $\overline{WBL}$, and an access transistor Q4 having the gate selectively controlled by the write word line WWL is connected between the internal node B and a write bit line $\overline{WBL}$. The write bit lines WBL and $\overline{WBL}$ forms a pair. In addition, an npn bipolar transistor T1 is formed in the memory cell and has the base connected to the internal node B, the collector connected to the high-potential power source 1 of the chip, and the emitter connected to a read bit line RBL. A sense amplifier 11 is connected to the read bit line RBL. As described above, according to this embodiment, the static memory cell is constituted by four PMOSFETs, one npn bipolar transistor, and two resistor elements. The two resistor elements may be, for example, thin film transistors or high resistance polysilicon.

A write operation of the cell is performed through the write word line WWL and the write bit lines WBL and $\overline{WBL}$. That is, since the write word line WWL connected to the memory cell to be selected is set to be a low potential, the access transistors Q3 and Q4 of the cell are turned on. Since the flip-flop of the memory cell is connected to the pair of bit lines WBL and $\overline{WBL}$, one of the pair of bit lines is set to be a high potential, and the other is set to be a low potential, thereby updating data of the memory cell. Since the write word line WWL is set to be the same potential as the high-potential power source during a period except for the write operation, power consumption of the memory cell during a cell waiting operation can be suppressed to be equal to that of the CMOS memory cell shown in FIG. 1.

A read operation of the memory cell is performed such that the read word line RWL connected to a memory cell to be selected is set to be a potential higher than that set during a waiting operation. The read word line RWL is charged to a voltage "$V_{REF}-Vf$" during the waiting operation with respect to a reference potential $V_{REF}$ applied to the base of a bipolar transistor $T_{REF}$. A potential $V_{REFH}$ ($>V_{REF}$) higher than the potential $V_{REF}$ is applied to the read word line RWL during a selecting operation, and a potential $V_{REFL}$ ($<V_{REF}$) lower than the potential $V_{REF}$ is applied to the read word line RWL during a non-selecting operation, i.e., the waiting operation. During the cell selecting operation, when the node B is set to be a high potential ($>V_{REF}$), the transistor T1 of a comparison differential amplifier constituted by the transistors T1 and $T_{RFE}$ is turned on, and the transistor $T_{REF}$ is cut off. Therefore, an output OUT of the sense amplifier 11 is charged by a resistor load $R_{REF}$ and outputs a high-potential output. The above operation is a read operation in a case wherein data "1" is read out. On the other hand, when the node B is set to be a negative potential (=VEE), the resistor T1 is turned off, and the transistor $T_{REF}$ is turned on. Therefore, the output OUT of the sense amplifier 11 outputs a low-potential output. This operation is a read operation in a case wherein data "0" is read out.

As described above, during the read operation, since the read word line RWL connected to a non-selected cell only is driven at an intermediate potential, the read word line RWL can be driven by an ECL logic circuit. Therefore, a time for the read operation of the memory cell can be suppressed almost equal to the time for the read operation of an ECL bipolar RAM. Since the resistor elements R1 and R2 can be vertically formed on a PMOSFET using polysilicon or the like, a cell area of the memory cell is not increased compared with that of the memory cell using the NMOSFET shown in FIG. 2. In addition, since a base current of a bipolar transistor in an ON time is supplied from the PMOSFET, the resistances of the resistor elements R1 and R2 are small enough to retain the charges of the internal nodes A and B, and consumption power during the waiting operation can be decreased to that of the cell shown in FIG. 2. When an n-type thin-film transistor is used in place of the high-resistance polysilicon transistor, the resistor elements can be arranged on the PMOSFET. Since the resistance of the transistor in an ON state is hundred to thousand times smaller than that of the high-resistance polysilicon, the transistor can be further stably operated.

Furthermore, since the collector potential of the npn transistor is fixed to the same potential as that of the high-potential power source, no collector isolation region is required, and the n-type well region of the PMOSFET can also be used as the collector isolation region. Unlike the memory cell in FIG. 2, the memory cell of the embodiment can be completely formed in the n-type single region without using any well isolation region. Therefore, since only the total area of the base and emitter regions of the npn bipolar transistor is an increase in memory cell region of the embodiment compared with the conventional memory cell having four high-resistance load transistors shown in FIG. 1, an increase in memory cell size is about twice that of the memory cell in FIG. 1 and smaller than the memory cell size in FIG. 2 by about 25% to 50%. In addition, when the drain of the PMOSFET Q2 and the external base of the bipolar transistor T1 are common used, the cell size can be further decreased.

Figure 4:
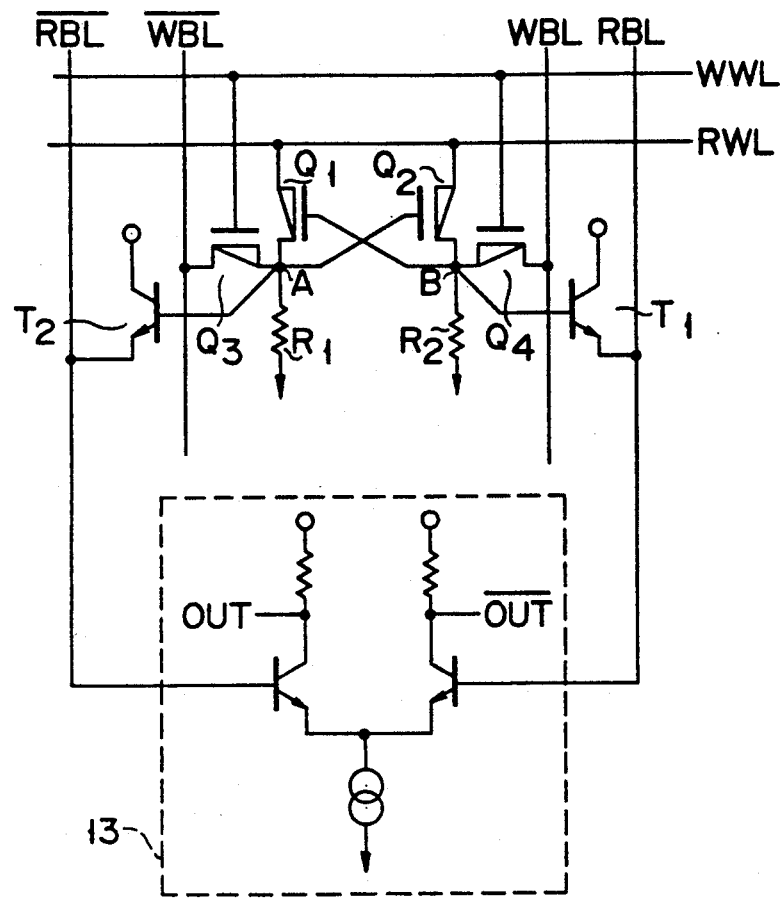

FIG. 4 is a circuit diagram showing a memory cell according to another embodiment of the present invention. This memory cell is obtained by adding an npn bipolar transistor T2 to the node A of the memory cell in FIG. 3. That is, although the cell size of the memory cell is increased by adding the bipolar transistor T2 to the read bit line $\overline{RBL}$ of a pair of read bit lines RBL and $\overline{RBL}$, since a differential read operation can be performed by a sense amplifier 13 due to the presence of the pair of bit lines RBL and $\overline{RBL}$, a read operation can be performed at a speed higher than that of the memory cell in FIG. 3.

Figure 5:
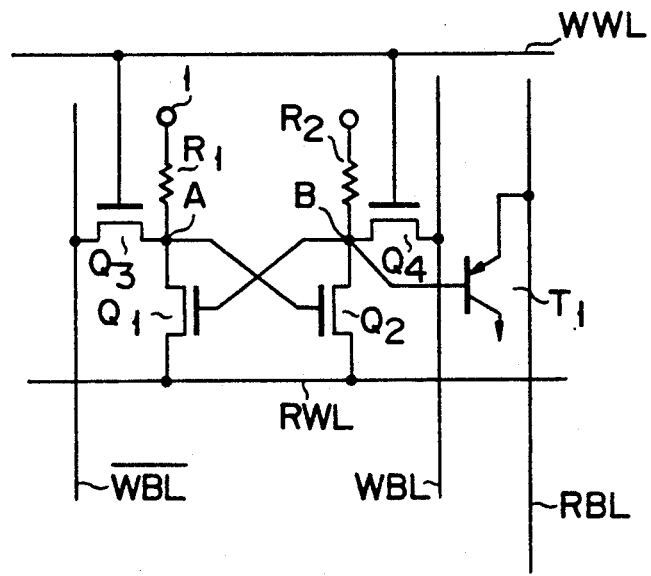

FIG. 5 is a circuit diagram showing a memory cell according to still another embodiment of the present invention. In FIG. 5, the memory cell is constituted by four NMOSFETs, one pnp bipolar transistor, and two resistor elements. In a complete BiMOS structure obtained by integrating the npn, pnp, and CMOS elements on the same substrate, a memory cell can be formed in a p-type well region. At this time, connections of potentials of the memory cell are paired with those of the memory cell in FIG. 3.

The present invention is not limited to the above embodiments, and various applications can be effected. For example, an NMOSFET can be used in place of the PMOSFET, and a pnp bipolar transistor can be used in place of the npn bipolar transistor. In this case, the positive potential power source is replaced with a negative potential power source, and the negative potential power source is replaced with a positive potential power source.

In a static memory cell according to the present invention, a read word line can be driven at an intermediate potential using an ECL logic circuit. Therefore, the memory cell can perform a read operation at a speed higher than the operation speed of a conventional CMOS memory cell because a CMOS logic circuit is not provided. In addition, since the memory cell is constituted by four first-channel MOSFET, one bipolar transistor of a first polarity, and two resistor elements, the memory cell of the present invention can be formed in a single conductive well region. Therefore, a cell area of the memory cell can be largely decreased compared with the conventional BiCMOS memory cell, and various effects such as an increase in integration density and an increase in storage capacity can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:
1. A static memory cell, comprising:
a first resistor element having one terminal connected to a first potential power source and another terminal connected to a first internal node;
a second resistor element having one terminal connected to said first potential power source and another terminal connected to a second internal node;
a first MOSFET having a channel of a first conductivity type, and having a drain connected to said first internal node, a source connected to a read word line, and a gate connected to said second internal node;

a second MOSFET having a channel of said first conductivity type, and having a drain connected to said second internal node, a source connected to said read word line, and a gate connected to said first internal node;

a third MOSFET having a channel of said first conductivity type, and having a drain connected to said first internal node, a source connected to said first write bit line, and a gate connected to a write word line;

a fourth MOSFET having a channel of said first conductivity type, and having a drain connected to said second internal node, a source connected to a second write bit line, and a gate connected to said write word line; and a first bipolar transistor of a polarity type having a collector connected to a second potential power source, a base of a second conductivity type connected to said second internal node, and an emitter connected to a first read bit line.

2. A memory cell according to claim 1, further comprising a second bipolar transistor of said polarity type having an emitter connected to said first read bit line, and a comparison amplifier comprising said first and second bipolar transistors.

3. A memory cell according to claim 2, further comprising a third bipolar transistor of said polarity type having a collector connected to said second potential power source, a base connected to said first internal node, and an emitter connected to a second read bit line.

4. A memory cell according to claim 1, wherein a potential of said write word line is set to be a potential of said first potential power source during a write operation, and complementary signals are supplied to said first and second write bit lines to perform a write operation.

5. A memory cell according to claim 1, wherein an absolute value of a potential of a selected read word line is larger than that of a potential of a non-selected read word line during a read operation.

6. A memory cell according to claim 3, further comprising a sense amplifier for comparing a potential of said read bit line with a potential of said second read bit line.

7. A memory cell according to claim 2, wherein a potential of said write word line is set to be a potential of said first potential power source during a write operation, and complementary signals are supplied to said first and second write bit lines to perform a write operation.

8. A memory cell according to claim 2, wherein an absolute value of a potential of a selected read word line is larger than that of a potential of a non-selected read word line during a read operation.

9. A memory cell according to claim 1, wherein said first conductivity type is N conductivity type, and said polarity type is NPN polarity type.

10. A memory cell according to claim 1, wherein said first conductivity type is P conductivity type, and said polarity type is PNP polarity type.

* * * * *